United States Patent [19]
Clemens et al.

[11] Patent Number: 5,889,653
[45] Date of Patent: *Mar. 30, 1999

[54] STRAP SPRING FOR HEAT SINK CLIP ASSEMBLY

[75] Inventors: Donald Clemens, The Colony; Matthew C. Smithers, Lewisville, both of Tex.

[73] Assignee: Thermalloy, Inc., Dallas, Tex.

[*] Notice: This patent issued on a continued prosecution application filed under 37 CFR 1.53(d), and is subject to the twenty year patent term provisions of 35 U.S.C. 154(a)(2).

The term of this patent shall not extend beyond the expiration date of Pat. No. 5,594,624.

[21] Appl. No.: 744,569

[22] Filed: Nov. 6, 1996

Related U.S. Application Data

[62] Division of Ser. No. 643,079, May 2, 1996, Pat. No. 5,594,624, which is a continuation of Ser. No. 349,672, Dec. 5, 1994, abandoned, which is a continuation-in-part of Ser. No. 223,011, Apr. 5, 1994, Pat. No. 5,371,652.

[51] Int. Cl.⁶ .................................................. H05K 7/20
[52] U.S. Cl. ........................... 361/704; 24/625; 174/16.3; 257/727; 361/717; 411/530
[58] Field of Search ................................. 267/150, 160; 165/80.3, 185; 174/16.3; 257/706, 707, 712, 713, 717–719, 722, 727; 361/702–704, 707, 709, 717–719, 722; 24/457, 458, 464, 466, 472, 473, 625; 248/505, 510, 316.7; 411/352, 516, 522, 523, 530

[56] References Cited

U.S. PATENT DOCUMENTS

| | | | |
|---|---|---|---|
| 5,208,731 | 5/1993 | Blomquist | 361/704 |
| 5,276,585 | 1/1994 | Smithers | 361/704 |
| 5,371,652 | 12/1994 | Clemens | 361/704 |
| 5,386,338 | 1/1995 | Jordan | 174/16.3 |
| 5,396,402 | 3/1995 | Perugini | 361/710 |
| 5,436,798 | 7/1995 | Wieland, Jr. | 361/710 |
| 5,448,449 | 9/1995 | Bright | 361/704 |
| 5,485,351 | 1/1996 | Hopfer | 361/704 |
| 5,594,624 | 1/1997 | Clemens | 257/727 |

*Primary Examiner*—Gerald Tolin
*Attorney, Agent, or Firm*—Woodcock, Washburn, Kurtz, Mackiewicz & Norris LLP

[57] ABSTRACT

A strap spring mounts a heat sink to an electronic device by snapping holes in the leg over ears of a catch on the socket. Two perpendicularly extending springs have an opening between them so that the springs fit between the fins of a heat sink and are latched in ratched indentations.

10 Claims, 6 Drawing Sheets

FIG. 4
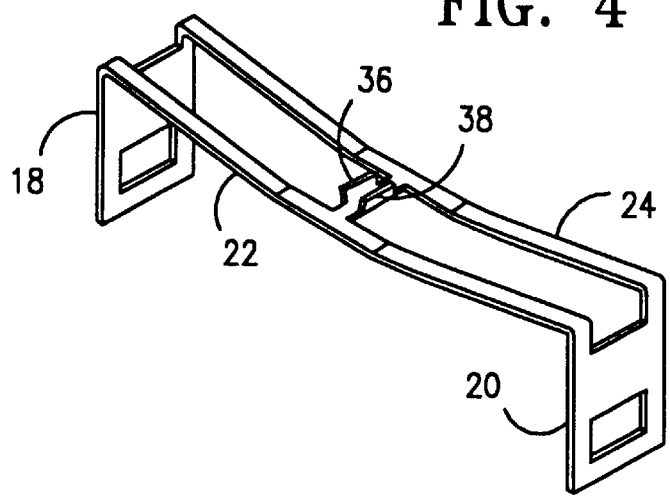
FIG. 5
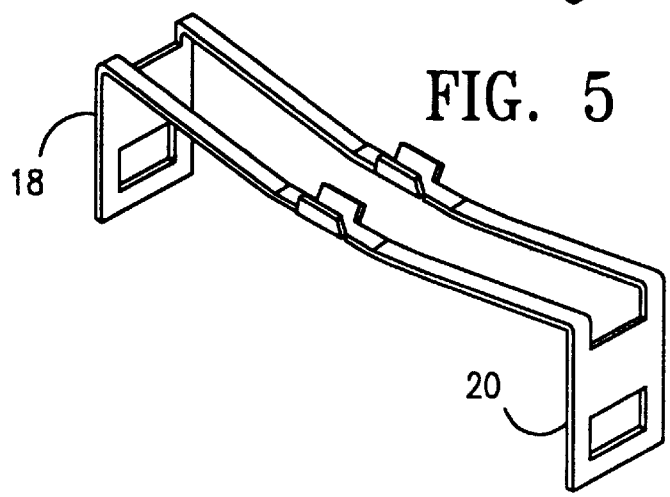
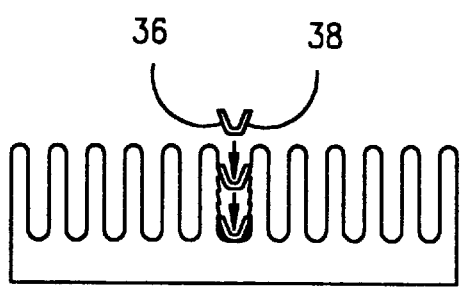
FIG. 4A
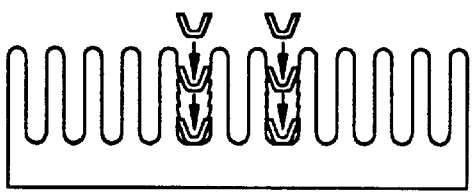
FIG. 5A

STRAP SPRING FOR HEAT SINK CLIP ASSEMBLY

This is a division, of application Ser. No. 08/643,079, now U.S. Pat. No. 5,594,624, filed May 2, 1996, which is a Rule 1.62 FWC of Ser. No. 08/349,672 filed Dec. 5, 1994, now abandoned which is a Continuation-in-Part of Ser. No. 08/223,011 filed Apr. 5, 1994, the disclosure of which is herein incorporated by reference, now U.S. Pat. No. 5,371,652.

This invention relates to securing electronic components together. More particularly, it relates to a strap spring for securing a heat sink, an electronic device and a socket.

BACKGROUND OF THE INVENTION

A heat sink placed in contact with an electronic device transfers heat through conduction from the semi-conductor device contained in the electronic package. U.S. Pat. No. 4,884,331-Hinshaw shows a commonly used pin fin heat sink.

Springs or clips such as shown in U.S. Pat. No. 4,745,456 Clemens, or U.S. Pat. No. 4,660,123-Hermann have been used to secure heat sinks to electronic devices. The catalog Thermalloy Semiconductor Accessories, pp. 15–29, shows clips for attaching heat sinks to electronic devices.

A pin grid array (PGA) is a frequently used electronic device. It includes a rectangular housing containing a semi-conductor device and pins extending downwardly from a lower surface of the housing. The pins fit into receptacles in the socket. As PGA's become larger and dissipate more heat, heat sinks become larger. Oftentimes, heat sinks are bonded or attached to the PGA in a manner in which the heat sink/PGA mass has the tendency to vibrate or slip out of sockets during shock and vibration tests.

It is an object of the present invention to provide a strap spring which securely attaches pin fin heat sinks to sockets.

SUMMARY OF THE INVENTION

In accordance with the present invention, a strap mounts a heat sink to an electronic device and an electrically insulating frame, such as a socket, which has latching means extending from it. The strap comprises two elongated springs which releasably grip a heat sink and urge it into thermal contact with the face of an electronic device and a perpendicularly extending leg having means to mate with the latch on the socket.

The elongated clip has a center portion including at least two springs with an opening therebetween. The springs are inserted between the fins of the heat sink to lodge the clip in the heat sink. An advantage of the narrow springs of the present invention is that they fit between the rows of pin fins, and a row of pins does not have to be removed for the strap to be installed.

The springs have tabs which imbed the strap in the heat sink. The imbedding feature makes the single assembly that is shipped to the customers. Therefore, the straps can be assembled with the pin fin heat sink and customers just put the entire assembly onto the socket. This reduces some of the labor for customers, as well as allows them to purchase and inventory only one part instead of two.

The foregoing and other objects, features and advantages of the invention will be better understood from the following more detailed description and appended claims.

BRIEF DESCRIPTION OF THE DRAWINGS

FIG. 4 depicts a strap with two center spring tabs for gripping and inserting it into a heat sink;

FIG. 4A depicts the insertion of the strap of FIG. 4 into a heat sink;

FIG. 5 shows a heat sink with two vertically disposed tabs on each spring;

FIG. 5A depicts the insertion of the strap of FIG. 5 into a heat sink;

DESCRIPTION OF THE PREFERRED EMBODIMENT

Figure 1:
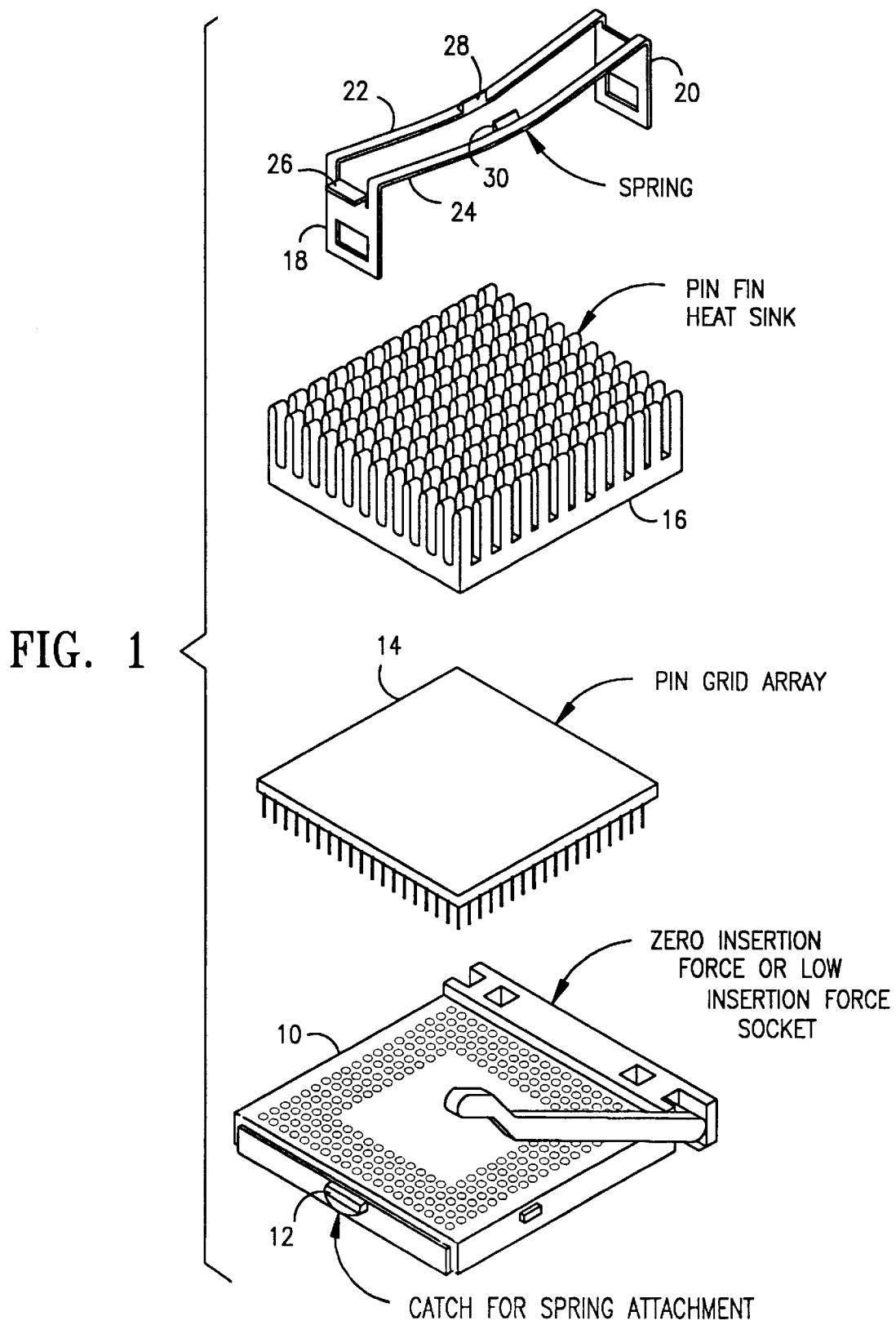
FIG. 1 is an exploded view of a strap in accordance with the present invention, a pin fin heat sink, a pin grid array, and a socket.

FIG. 1 shows an insulating frame 10, which in this case is a zero insertion, force, or low insertion force, socket. A catch 12 includes a projecting ear. The socket has a pair of ears extending from opposites of the socket. Alternatively, the ears can be on the electronic device itself so the heat sink can be directly secured to the electronic device as in "Spring Clamp Assembly With Electrically Isolating Shoe," Ser. No. 08/233,011, filed Apr. 5, 1994, now U.S. Pat. No. 5,371,652 (Attorney File 4675.1041/P/CIP), which is incorporated herein by reference.

The electronic device is a pin grid array 14 which has pins extending downwardly and insertable into the receptacles of the socket 10. Alternatively, the invention can be used with a ball grid array.

A pin fin heat sink 16 has spaced fins which dissipate heat from the pin grid array 14.

In accordance with the present invention, a strap for mounting the heat sink 16 to the pin grid array 14 has two legs 18 and 20 at the extremes of an elongated center portion which includes flat longitudinal springs 22 and 24. Springs 22 and 24 define an opening between them. The springs are insertable between the fins of the heat sink 16. The embodiment of FIGS. 1 and 2 has two legs 18 and 20 and is generally U-shaped. A strap having three, four, or more, springs may be made.

The legs 18 and 20 each have an opening which engages the catch 12 on the socket to securely mount the heat sink 16 against the pin grid array 14.

The thumb tab 26 is used to push the elongated clip down over the catch 12 on the socket. The leg 20 is first secured to a catch on the side of the frame opposite catch 12. Then, the thumb tab 26 is pushed downwardly until the catch (or ear) 12 snaps into the hole in the leg 18.

Vertically extending spring tabs 28 and 30 lodge the springs securely between the fins of the heat sink. A heat sink is normally shipped to a customer with a strap spring. The spring tabs 28 and 30 secure the springs of the strap to the heat sink during shipment.

Figure 2:
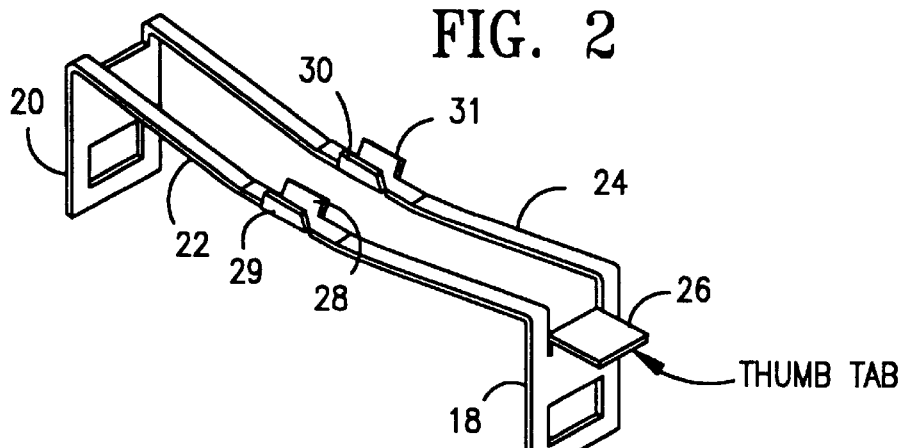
FIG. 2 shows a strap of the present invention.
Figure 2A:
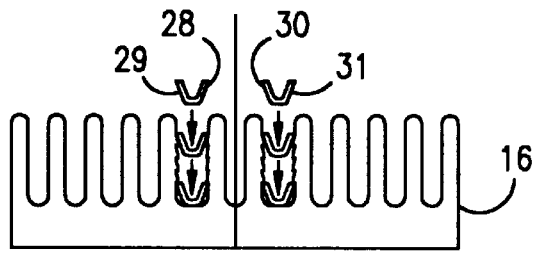
FIG. 2A depicts the manner in which the spring tabs on the strap are inserted between the fins of the heat sink to lodge it.

This is better shown in FIGS. 2 and 2A. As shown in FIG. 2, each spring has two vertically extending spring tabs, 28 and 29 on spring 22 and spring tabs 30 and 31 on spring 24. As shown in FIG. 2A, when the strap spring is inserted into the heat sink, spring tabs 28–29 and 30–31 are compressed inwardly as they move over the ratchet indentations in opposed surfaces of the fins. The spring tabs are lodged in a pair of opposed indentations. This holds the strap spring securely in the heat sink during shipment. Alternatively, the heat sink may have only one pair of indentations in the opposed fins, or the fins may be smooth-sided.

Figure 3:
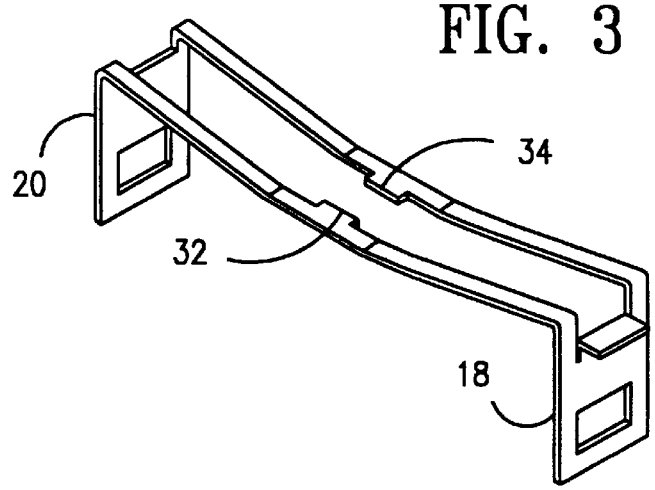
FIG. 3 shows an embodiment with horizontally extending spring tabs.
Figure 3A:
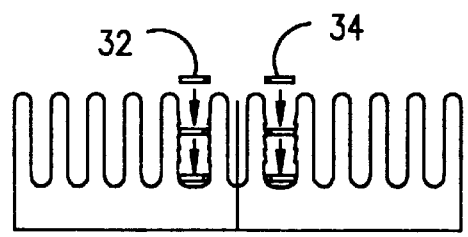
FIG. 3A depicts the insertion of the strap of FIG. 3 into a heat sink.

Alternate embodiments are shown in FIGS. 3–6 and the insertion of these embodiments into the heat sinks are shown in FIGS. 3A–6A. In FIG. 3, horizontally extending spring tabs 32 and 34 engage the sides of the fins of the heat sink. They engage the ratchet indentations or the smooth side of the fins to hold the spring in the heat sink.

In FIG. 4, vertically extending spring tabs 36 and 38 are on a center extension between the springs 22 and 24.

FIG. 5 is like the embodiment of FIG. 2, except that it has no thumb tab.

Figure 6:
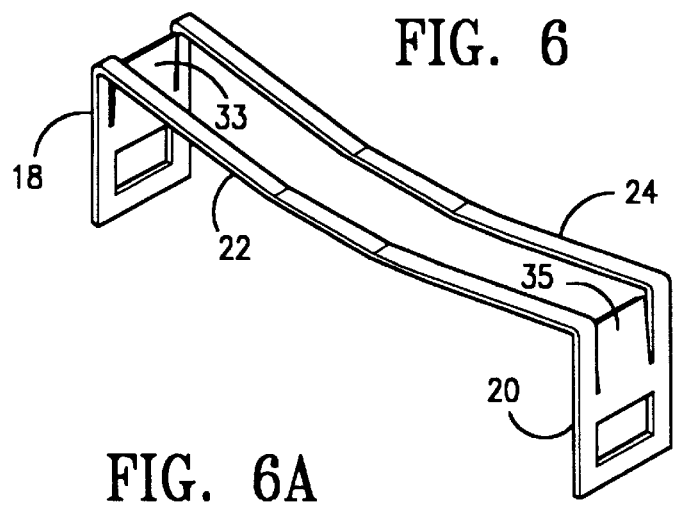
FIG. 6 depicts an alternate embodiment of the strap.
Figure 6A:
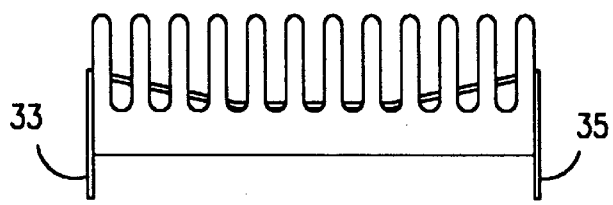
FIG. 6A depicts the insertion of the strap spring of FIG. 6 into a heat sink.

As depicted in FIGS. 6 and 6A, the springs 22 and 24 are bowed downwardly. In this embodiment, the legs 18 and 20 have slots to form tabs 33 and 35. These tabs snap under the ratchet indentations on the outside fins of the heat sink to hold the spring strap in place in the heat sink during shipment.

Figures 7, 7A:
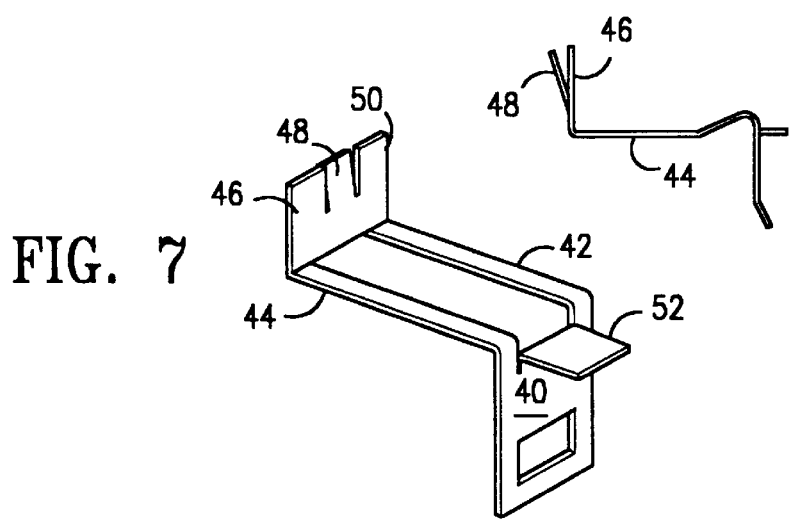
FIG. 7 is an alternate embodiment of the invention.
FIG. 7A is a side view of the strap of FIG. 7.
Figures 8, 8A:
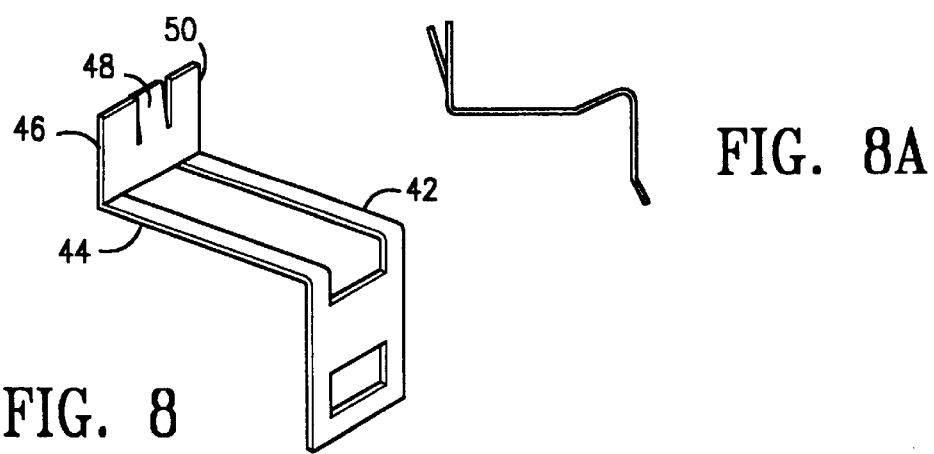
FIG. 8 shows a strap like FIG. 7, but without a thumb tab.
FIG. 8A is a side view of the embodiment of FIG. 8.

FIGS. 7 and 8 show modifications in which a single clip 40 has two elongated springs 42 and 44 which are bent slightly.

Two single clips are used, one for each end of the pin fin heat sink, to attach it to the socket. Projections 46, 48 and 50 wedge between pins in the heat sink. The center projection 48 is displaced slightly from the flanking projections 46 and 50. The advantage of this embodiment is that it is universal and can be used on any size pin fin heat sink, whereas the other embodiments have to be sized for a particular size socket.

The embodiment of FIG. 7 has a thumb tab 52 whereas the embodiment of FIG. 8 does not.

Figure 9:
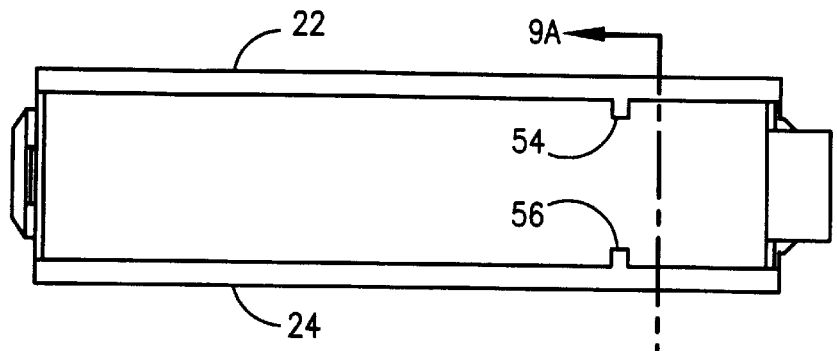
FIG. 9 shows a modification with a nub.
Figure 9A:
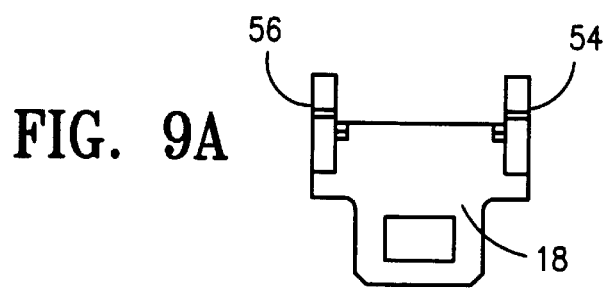
FIG. 9A is a view on the section A—A of FIG. 9.
Figure 9B:
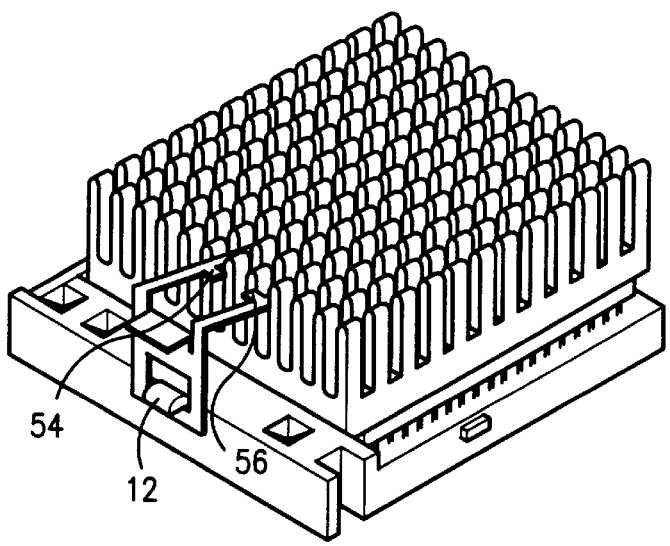
FIG. 9B is an isometric view of the strap of FIG. 9.

The embodiment of FIGS. 9 and 9A has nubs 54 and 56 which prevent relative movement between the strap and the heat sink. These nubs fit against the pins and keep the heat sink from sliding in the longitudinal direction of the springs, if the socket is larger than the heat sink.

Figure 10:
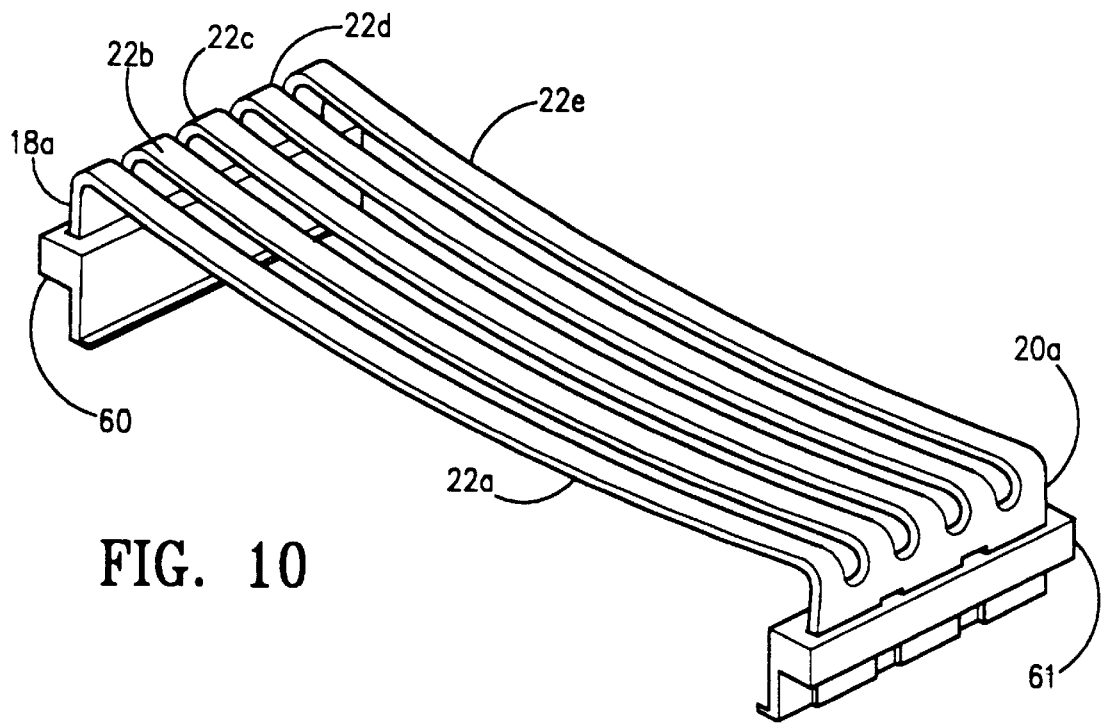
FIG. 10 shows another aspect of the present invention.

FIG. 10 shows a modification with more than two flat springs 22a, 22b, 22c, 22d, and 22e extending perpendicularly from clips 18a and 20a. Electrically insulating plastic shoes, or feet, 60 and 61, are connected to legs 18 and 20. The shoes urge the frame which may be part of the pin grid array, into thermal contact with the heat sink. The plastic feet grip beneath the PGA to attach the heat sink to the PGA. An alternative way is to grip below the socket, if a socket is used with the PGA. In other words, the spring works the same in either case, but it either clips to the PGA, or is made longer to clip down below the edge of the socket. This is used in cases where the socket does not have "nubs" for use of attachment of springs. The plastic feet, one each end of the spring, slide beneath the PGA or socket and extend almost to the pins. If the plastic foot were not used, a metal foot would short between the pins on the PGA or socket. The plastic feet are more fully described and claimed in Spring Clamp Assembly With Electrically Insulating Shoe, "Ser. No. 223,011, filed Apr. 5, 1994, now U.S. Pat. No. 5,371,652 (Attorney Docket 4775.104/P/CIP), which is incorporated herein by reference.

Figure 11:
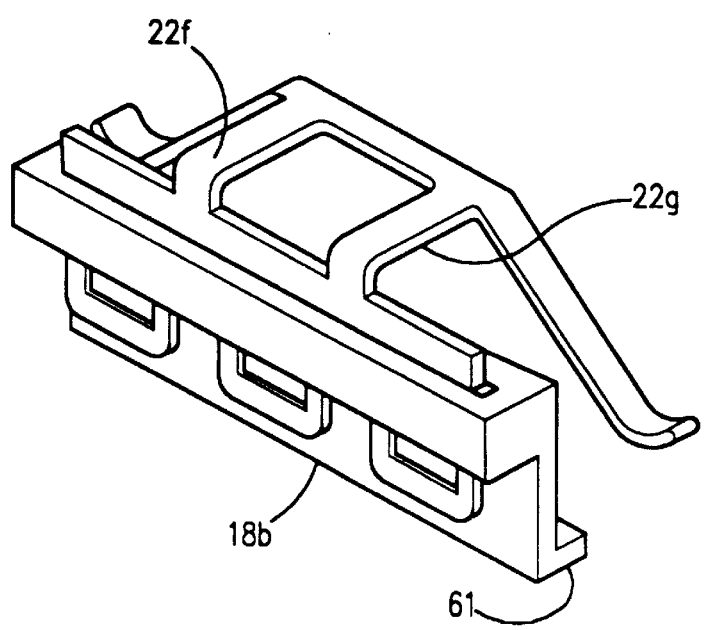
FIG. 11 shows yet another aspect of the present invention, including certain features of the embodiment shown in FIG. 10.

The strap of the present invention can be advantageously made by the stamping and forming process disclosed in pending application Ser. No. 226,632, filed Apr. 12, 1994, now abandoned, entitled "Stamped and Formed Heat Sink", (Attorney Docket THRM-0004) which is incorporated herein by reference. FIG. 11 shows an example of a stamped and formed strap which includes flat springs 22f and 22g extending perpendicularly from clip 18b. Stamped and formed strap in accordance with the inventors have the advantage that the process can be automated and the straps made very inexpensive.

The foregoing and other embodiments of the invention are covered by the appended claims.

What is claimed is:

1. An apparatus for use with an electronic device with an electrically insulating frame, said apparatus comprising:

a heat sink having a plurality of spaced fins and having at least one pair of rachet indentations on opposed fins;

a strap comprising:

a flat, straight leg for releasably gripping said frame and for urging said heat sink into thermal contact with a face of said electronic device, said leg having an opening for mating with an ear on said frame;

at least two longitudinal spring members extending generally perpendicularly to said leg with an opening between said spring members, said spring members adapted to fit between said fins of said heat sink to hold said heat sink, said spring members being lodged in said rachet indentations; and a central projection and two other projections extending generally perpendicularly from said spring members, the central projection being bent outwardly from the other projections for flexibly engaging a fin of said heat sink.

2. The strap recited in claim 1 wherein the central projection is a central projection disposed between said two other projections.

3. The strap recited in claim 1 wherein the central projection is separated from the other projections by a pair of slots.

4. The strap recited in claim 1 wherein each one of the central projection and the other projections extend from the spring members opposite from the leg to form a Z-shaped strap.

5. The strap recited in claim 1 wherein at least one of the spring members is connected to a lower end of at least one of the central projection and the other projections, and at least one of the spring members is connected to an upper end of the leg to form a Z-shaped strap.

6. The strap recited in claim 1 wherein at least a portion of each one of the central projection and the other projections are co-linear.

7. The strap recited in claim 1 wherein the spring members are longer in the longitudinal direction than in a direction perpendicular to the longitudinal direction.

8. The strap recited in claim 1 wherein the opening is rectangular.

9. An apparatus comprising:

a heat sink having a plurality of spaced fins;

an electronic device having an electrically insulating frame and a socket, said frame having two ears; and two straps, comprising a strap being positioned on a side of said heat sink and another strap being positioned on another side of said heat sink; each one of said two straps comprising:

only one flat straight leg releasably gripping said frame and urging said heat sink into thermal contact with a face of said electronic device, said leg having an opening mating with one of the ears of said frame;

at least two longitudinal spring members extending generally perpendicularly to said leg with an opening between said spring members, said spring members fitting between said fins of said heat sink to hold said heat sink, said spring members securing said heat sink to said electronic device; and a central projection and two other projections extending generally perpendicularly from said spring members, the central projection being bent outwardly from the other projections for flexibly engaging a fin of said heat sink.

10. Apparatus mounting a heat sink having a plurality of spaced fins to an electronic device comprising:

insulating frame means supporting said electronic device having a pair of spaced ears extending from opposite sides of said frame;

an elongated clip releasably gripping said heat sink and urging it into thermal contact with the face of said electronic device, said elongated clip being generally U-shaped with two flat straight legs at the extremes of an elongated center portion, each of said legs having an opening in each end thereof which mate with one of said ears on said frame;

said elongated clip having a center portion including two springs extending generally perpendicularly to said legs with an opening therebetween, said springs being inserted between the fins of said heat sink to lodge said clip in said heat sink; and a tab on each of said legs, each tab being separated from each one of said springs by slots so that said tab flexibly engages a fin of said heat sink.

* * * * *